United States Patent
Yamaguchi et al.

[11] Patent Number: 6,117,704
[45] Date of Patent: Sep. 12, 2000

[54] STACKABLE LAYERS CONTAINING ENCAPSULATED CHIPS

[75] Inventors: James S. Yamaguchi, Laguna Niguel; Volkan H. Ozguz, Aliso Viejo; Andrew N. Camien, Costa Mesa, all of Calif.

[73] Assignee: Irvine Sensors Corporation, Costa Mesa, Calif.

[21] Appl. No.: 09/282,704

[22] Filed: Mar. 31, 1999

[51] Int. Cl.[7] ............................ H01L 21/44; H01L 21/48; H01L 21/50

[52] U.S. Cl. ........................ 438/100; 438/113; 438/127; 438/460

[58] Field of Search ................................. 438/106, 110, 438/113, 127, 460

[56] References Cited

U.S. PATENT DOCUMENTS 5,478,781  12/1995  Bertin et al. .
5,952,725   9/1999  Ball .

*Primary Examiner*—Kevin M. Picardat
*Assistant Examiner*—D. M. Collins
*Attorney, Agent, or Firm*—Thomas J. Plante

[57] ABSTRACT

A method and structure are disclosed which involve the re-wafering of previously processed and tested IC chips. The chips are encapssulated in supporting non-conductive material in a neo-wafer, so that they may be further processed preparatory to dicing layer units from the neo-wafer, which layer units are ready for stacking in a three-dimensional electronic package. Although the layer areas are the same, different stacked layers may contain different sized IC chips, and a single layer may encapsulate a plurality of chips. Precision of location of the separate IC chips in the neo-wafer is insured by use of photo-patterning means to locate openings in the neo-wafer into which extend conductive bumps on the chips. The neo-wafer is preferably formed with separate cavities in which the chips are located before they are covered with the encapsulating material.

15 Claims, 9 Drawing Sheets

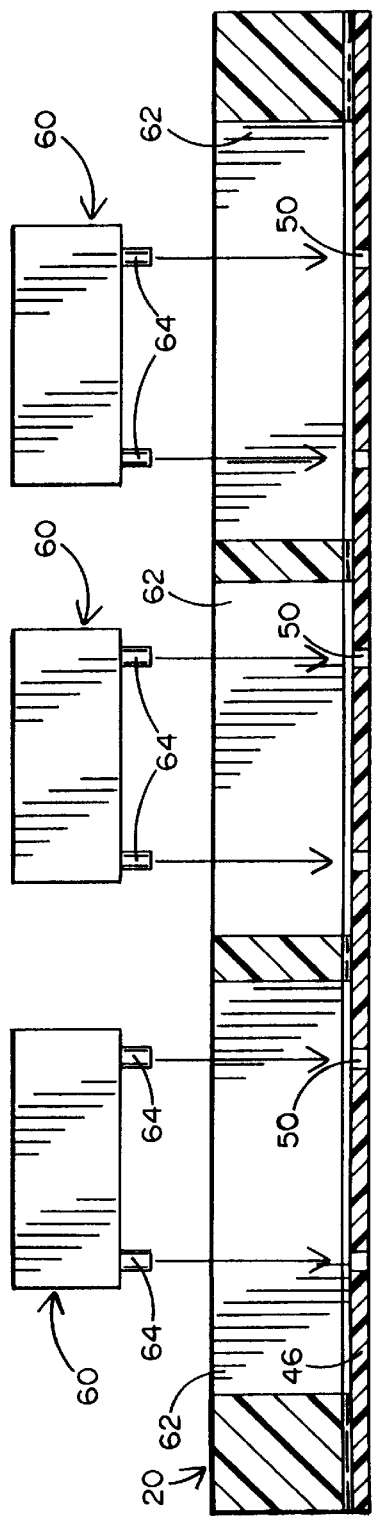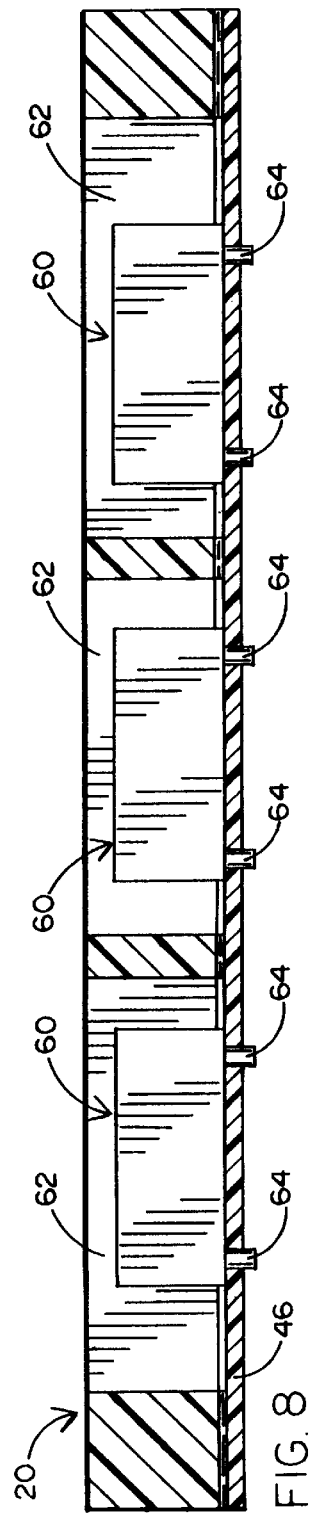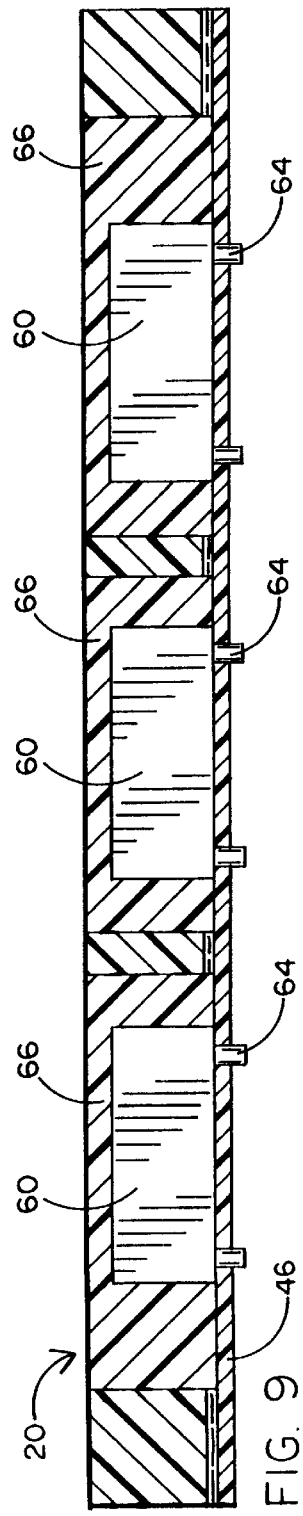

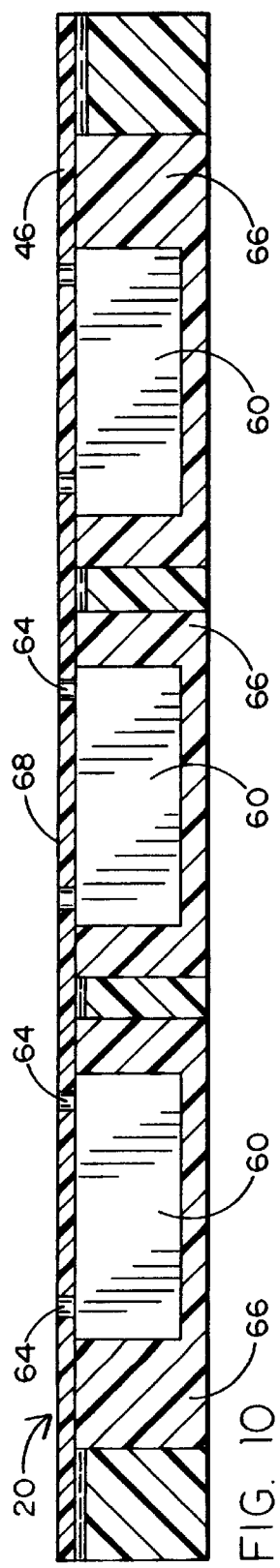
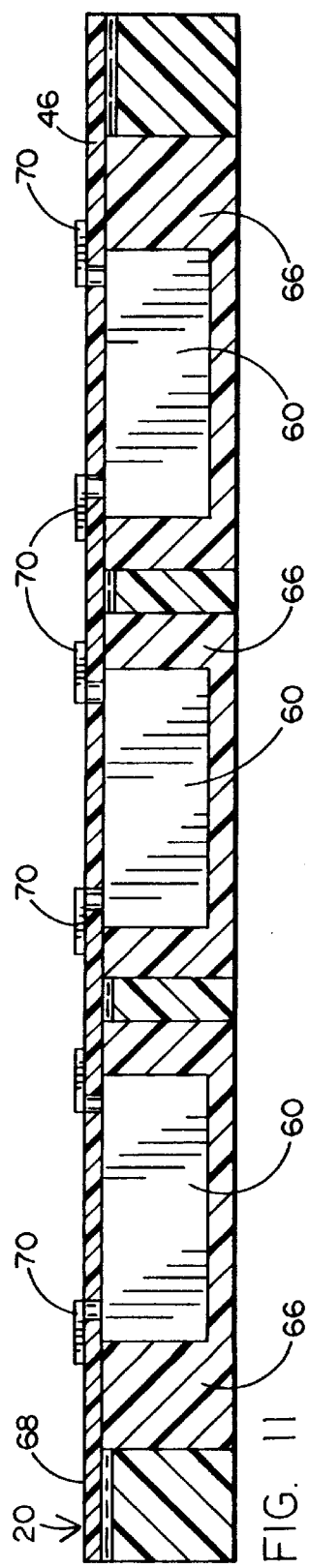
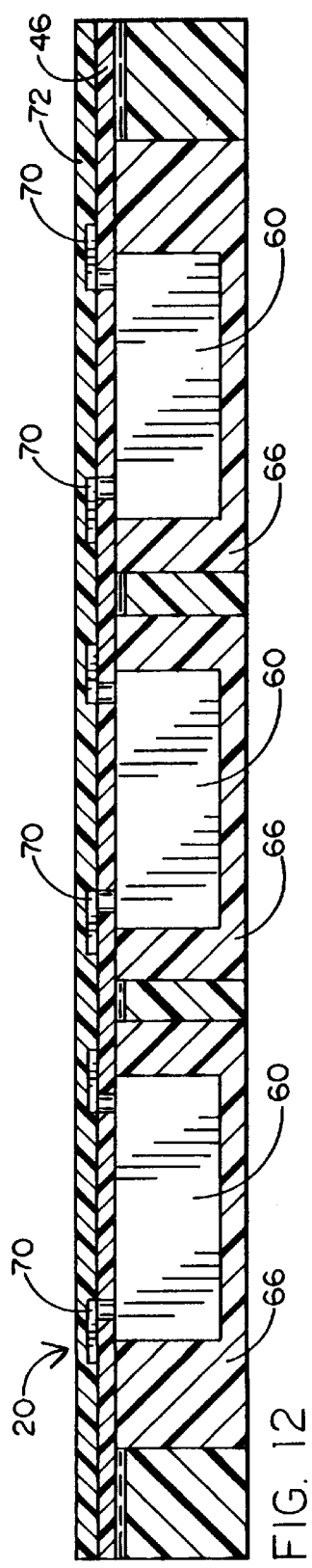

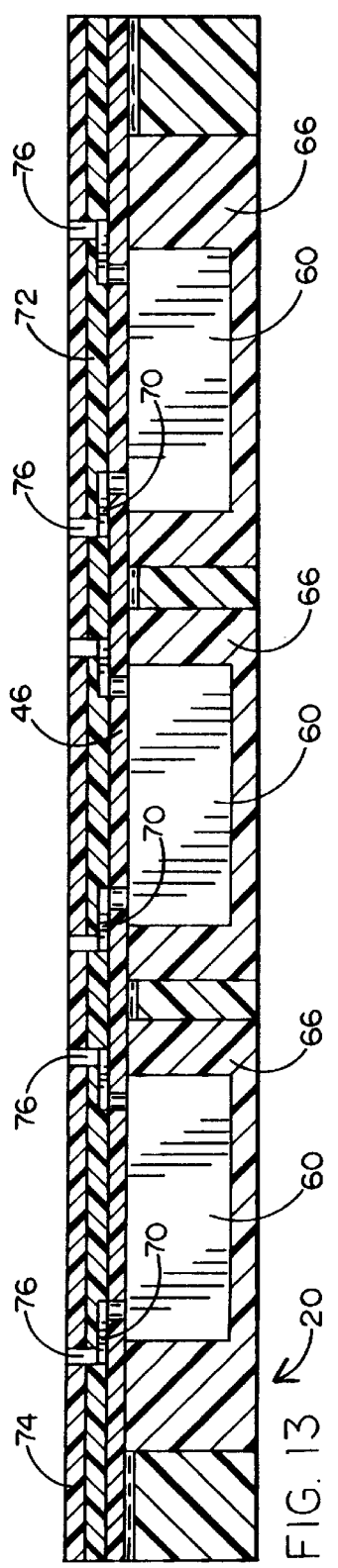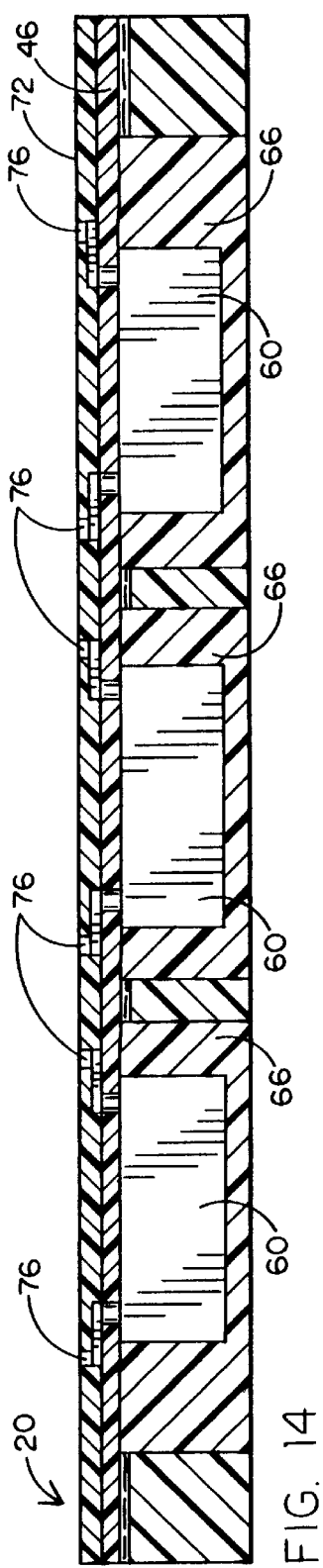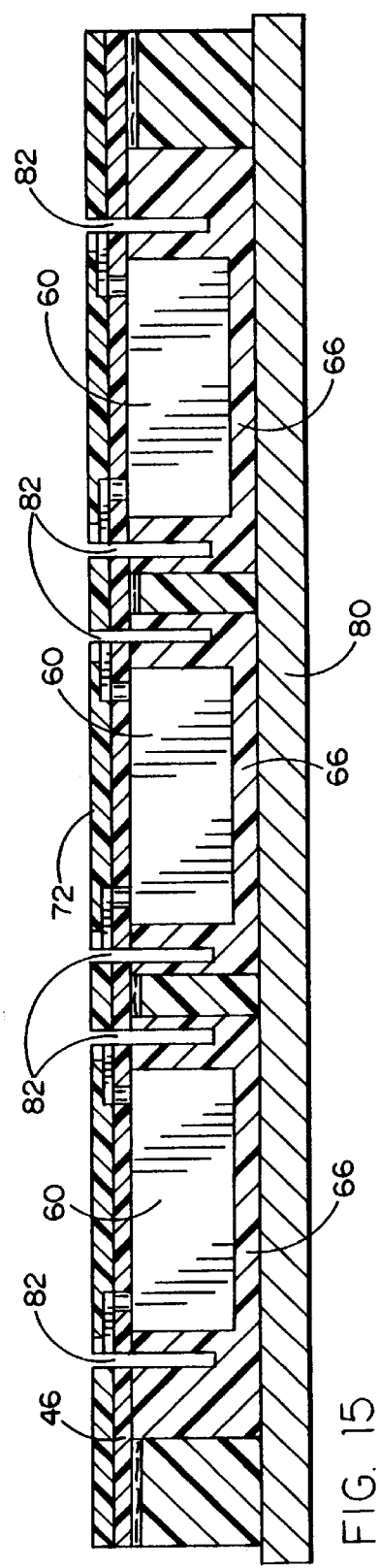

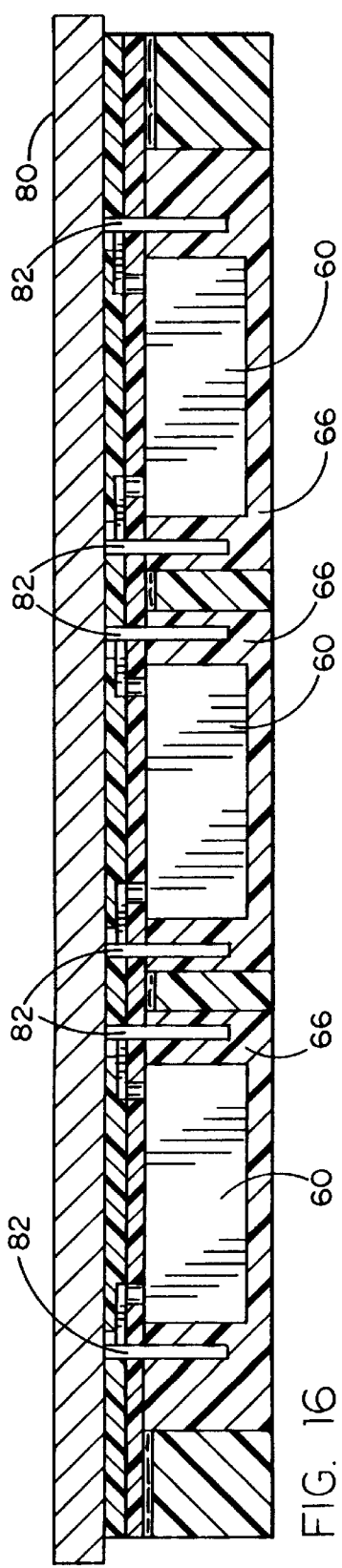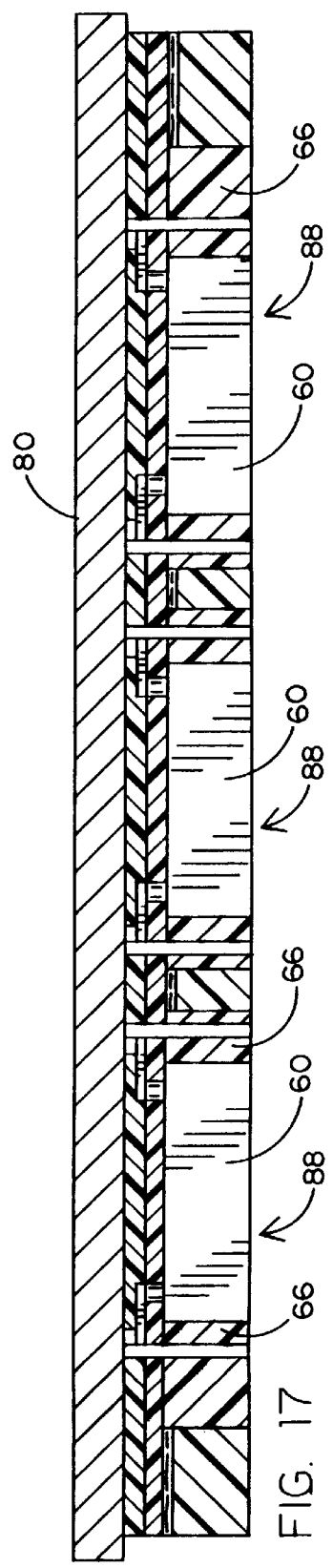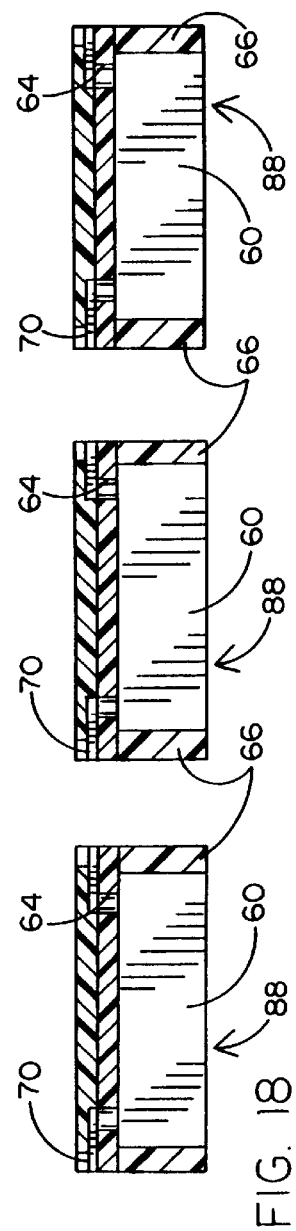

STACKABLE LAYERS CONTAINING ENCAPSULATED CHIPS

BACKGROUND OF THE INVENTION

This invention relates to the stacking of chips, or die, such as chips containing integrated circuitry.

In common assignee application Ser. No. 777,747, filed Dec. 21, 1996, U.S. Pat. No. 5,953,588 stackable IC chip layers were disclosed which permit chips having different functions and therefore different areas to be stacked as if they were same size chips, using stacking and electrical connection techniques and tools which have been developed for same size chips. The new units were referred to as "neo" (or "pseudo" or "virtual") chips. In addition to the advantage of being able to use chips of varying sizes in a given stack, that invention permits the processing and stacking of chips purchased as individual die, which are more readily available than chips purchased in wafer form. Furthermore, the chips purchased as individual die are generally "known good" die, which have been "burned in", and are therefore pre-tested prior to stacking.

As disclosed in the prior application, a re-wafering process is used, in which a neo-wafer is formed encapsulating known good chips, so that the chips can be prepared for stacking by covering their active surfaces with a dielectric layer, forming vias through the dielectric layer to reach the terminals on the respective chips, and metallizing to provide electrical connections from the chip terminals to side surfaces of the layer, which are created when the neo-wafer is diced, or sliced, to provide individual layers ready for stacking.

Prior to the invention of application Ser. No. 777,747, the extra steps required preparatory to stacking were sometimes carried out while the chips were still in their original wafer form. The wafer concept is almost universally used to simultaneously form integrated circuits (ICs) in numerous locations in the wafer, so that a multiplicity of separate IC chips will be created when the wafer is diced. Since preparation for stacking requires that the chip surfaces be metallized to connect their terminals to suitable access planes on the stack, manufacturing steps beyond the normal wafer processing steps are required, if stacking is intended. In some cases, chips in TSOP (packaged) form have been electrically connected to external circuitry by means of metal frames which are formed as part of the TSOP structure.

In the process disclosed in application Ser. No. 777,747, the chips which have been previously formed in a wafering process, and tested to insure their performance, need to be re-wafered, so they can be processed for subsequent stacking. Even in the case of a single chip, it is not feasible to perform the pre-stacking processing steps without using a neo-wafer, which proves a large enough body to permit efficient handling. Of course, the manufacturing process is much more cost effective if the neo-wafer contains a plurality of pre-formed, pre-tested chips which can be simultaneously prepared for stacking. The neo-wafer is subsequently diced to form individual layers ready for stacking. In effect, two wafering and dicing processes are used to facilitate stacking of chip-encapsulating layers.

As stated in the specification of application Ser. No. 777,747, the "primary challenge in using a neo-wafer containing multiple die is the accurate location of each die. *** With multiple die in the wafer, the accuracy necessary to locate each die prior to potting creates a potential alignment problem."

SUMMARY OF THE INVENTION

The present invention improves the re-wafering process by making location of chips (die) in the neo-wafer highly accurate, and by making it more feasible to include multiple chips in the neo-wafer. The neo-wafer is so structured that each chip it contains is precisely located by use of a single masking step to obtain exact location of the known good chips, which are inserted in the neo-wafer and then covered by potting material. Then the chips in the neo-wafer are simultaneously processed to prepare them for stacking. They are stacked after they have been diced from the neo-wafer.

Since, with the present invention, the locations of the chips in the neo-wafer are controlled by photo patterning (photo-lithography), their relative locations are determined with the very high precision inherent in the use of a single mask to control the locations of all chips in the neo-wafer.

Another significant advantage of the present invention is that any leakage of potting material onto the active (upper) surfaces of the chips in the neo-wafer does not affect the electrical terminals on the chips, so that removal of any such leaked material is not required, and increased reliability of the electrical connection is obtained.

The benefits of the present invention are obtained by using a wafer frame, sometimes called a "picture frame", having a plurality of separate chambers, or cavities, into which the individual known good chips are inserted. The chips have conductive bumps which extend into and through pre-formed small holes (vias) in the surface of the wafer frame. The via holes have been formed using photo-lithography with a single mask for the entire neo-wafer, thus insuring precise location of the via holes relative to one another. This insures precise location of the separate chips relative to one another, and provides terminals accessible for electrical connections.

BRIEF DESCRIPTION OF THE DRAWINGS

FIGS. 7 and 8 show the insertion of known-good chips into the chambers of the neo-wafer;

FIG. 9 shows the neo-wafer after insertion of chip-encapsulating material;

FIGS. 10–14 illustrate successive steps in processing the neo-wafer containing the inserted chips;

FIGS. 15–17 illustrate the steps in dicing the neo-wafer to separate the chip-encapsulating layers;

FIG. 18 shows a cross-section of a layer ready for stacking; and

DETAILED DESCRIPTION OF SPECIFIC EMBODIMENTS

Figure 1:
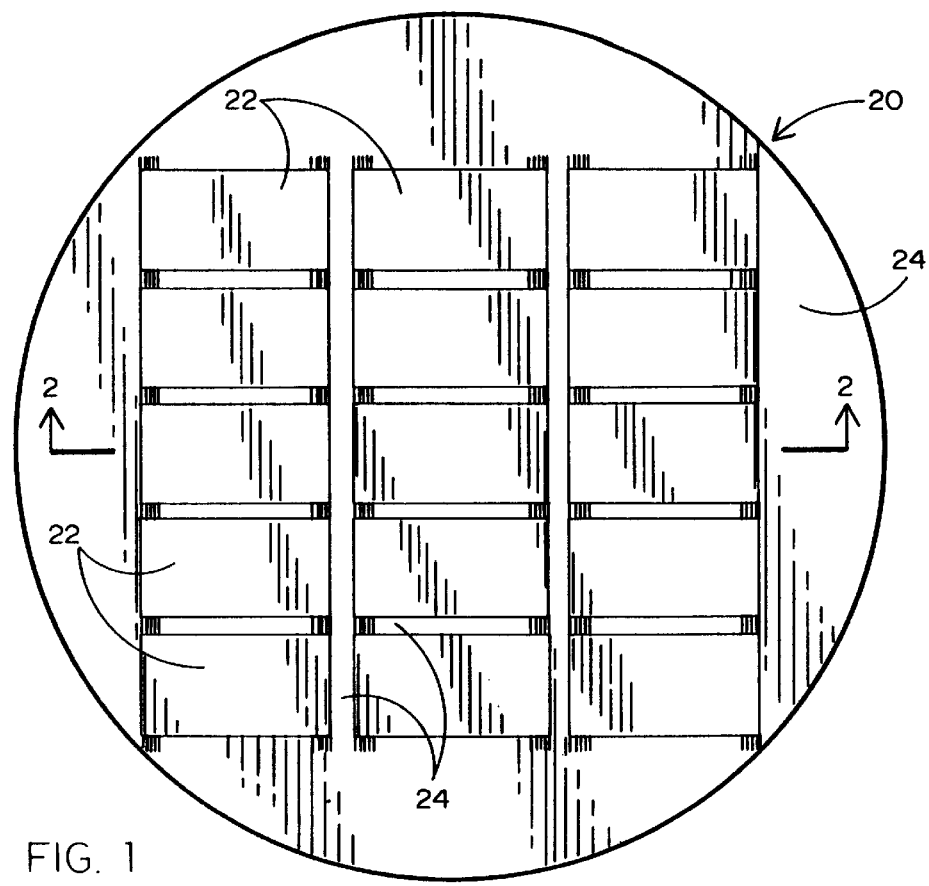
FIG. 1 is a plan view showing a neo-wafer having a plurality of chips encapsulated in potting material and ready for dicing into a plurality of stackable layers.
Figure 2:
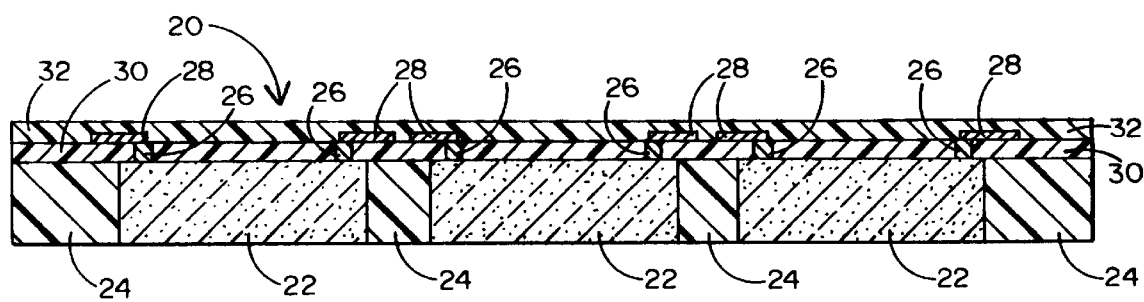
FIG. 2 is a vertical section taken on the center line of FIG. 1.

FIGS. 1 and 2 show a neo-wafer 20, which is ready to be diced into individual chip-containing layer units for stacking to form a three-dimensional package. Each layer unit may contain one, or more than one, chip. But the area of each layer unit should be the same, in order to facilitate stacking for the purpose of providing a high-density electronic package.

The neo-wafer of FIGS. 1 and 2 shows 15 rectangular chips 22, encapsulated in dielectric supporting material, e.g., potting material 24, with the neo-wafer ready to be diced to form separate, stackable layer units. The number of chips 22 in the neo-wafer may be varied from one to a very large number. The size of the layer units in different neo-wafers will vary depending on the types of chips and on the number of chips in each layer unit.

The potting material 24, e.g., epoxy, is shown between and around the separate chips 22. Dicing will be performed through the material 24 to provide separate chip-encapsulating layer units. Above each chip (see FIG. 2) are shown conductive bumps 26, e.g., gold bumps, which provide electrical contact with IO (input/output) terminals on the chips, which terminals are electrically joined to the integrated circuitry in the respective chips. Above the conductive bumps 26 are metallic leads (traces) 28 which connect the chip terminals to one or more sides of the layer units which are formed when the neo-wafer is diced. Dielectric material is shown on top of the neo-wafer, in two separate films (or layers) 30 and 32. A preferred dielectric material is polyimide which is readily used in photo-patterning. Two dielectric layers are preferred, one above and one below the metallic leads 28. Using three or more dielectric layers accommodates one or more extra layers of traces to provide a more complex electrical interconnect pattern.

Numerous steps are performed in creating the neo-wafer structure. It has proved desirable to form separately a photo-patterned flat carrier sub-assembly 40 and a "picture frame" sub-assembly 42 having a plurality of chambers (cavities) into which chips are inserted. The sub-assemblies 40 and 42 are secured together and suitably modified to form the container for neo-wafer 20. The reasons for combining the sub-assemblies 40 and 42 are (a) the frame structure 42 prevents sagging of the flat carrier 40, and (b) the separate chambers of frame structure 42 avoid undue stress build-up in the potting material 24.

Figure 3A:
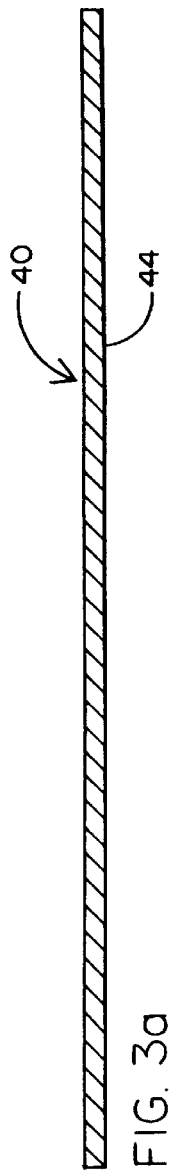
FIGS. 3a–3e illustrate successive steps in forming the flat carrier sub-assembly of the neo-wafer structure.
Figure 3B:
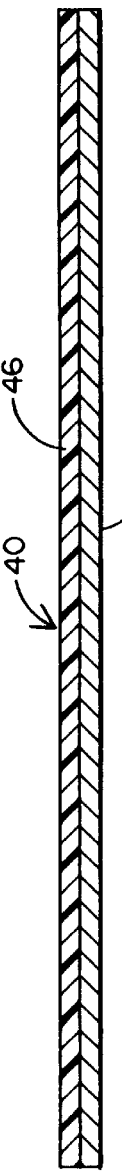
Figure 3C:
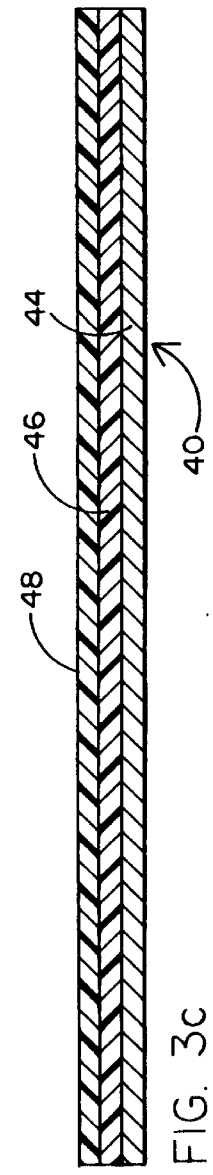

FIGS. 3a to 3e illustrate suitable steps for forming the flat carrier sub-assembly 40. FIG. 3a shows a flat alignment carrier in the form of a metallic plate 44, e.g., aluminum shim stock material about 10 mils thick. FIG. 3b shows a layer of dielectric material 46, e.g., polyimide material about 12 mils thick, on top of plate 44. FIG. 3c shows a layer of photoresist material 48 formed on the polyimide layer 46.

Figure 3D:
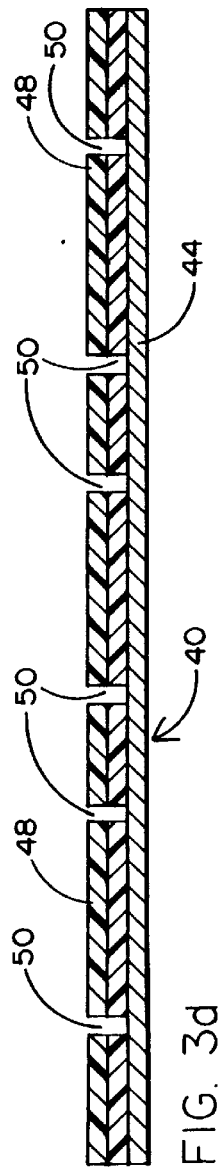
Figure 3E:
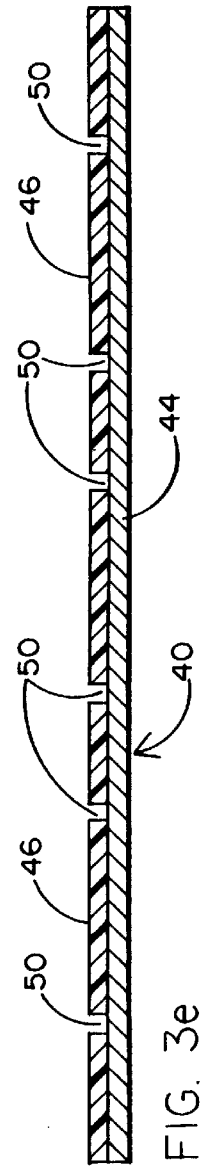

FIG. 3d shows the sub-assembly 40 after photoresist layer 48, using a suitable mask, has been exposed and developed to provide openings or vias 50 which extend through the polyimide layer 46. The openings 50 are precisely located in the sub-assembly 40 due to the inherent precision of the masking/lithography process. All openings to locate all chips in the neo-wafer are simultaneously positioned and formed. FIG. 3e shows the sub-assembly after the photoresist layer 48 has been stripped and the polyimide layer 46 has been finally cured.

Figure 4A:
FIGS. 4a–4d illustrate successive steps in forming the "picture frame" sub-assembly of the neo-wafer structure.
Figure 4B:
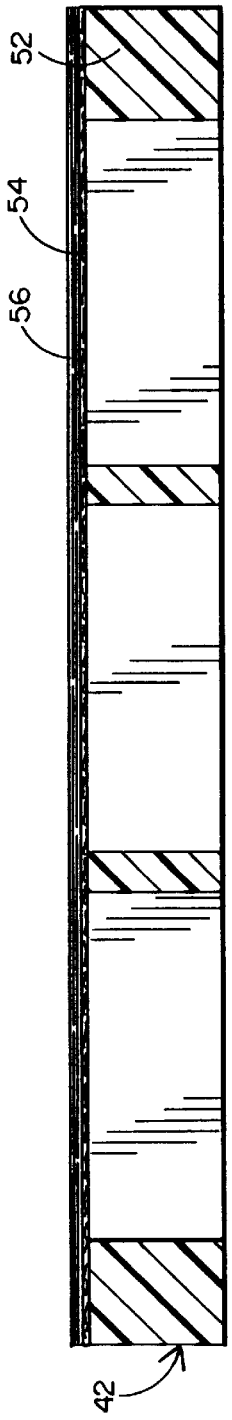
Figure 4C:
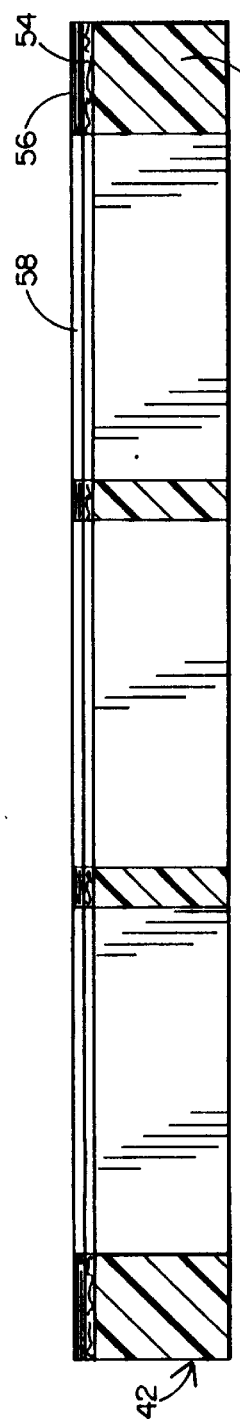
Figure 4D:
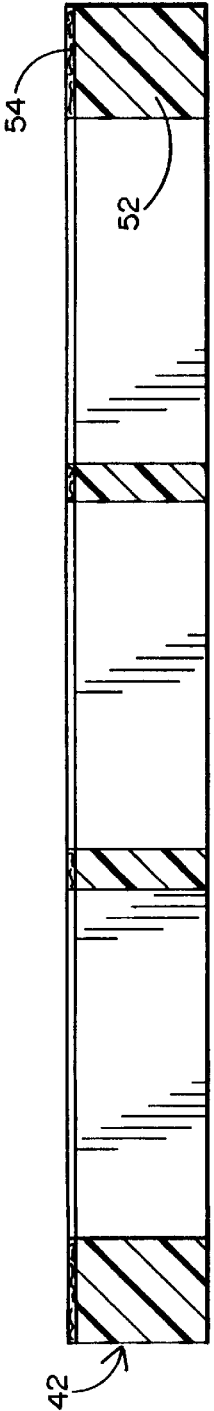

FIGS. 4a to 4d illustrate suitable steps for forming a "picture frame" sub-assembly 42 ready to be secured to carrier sub-assembly 40. A picture frame structure 52 is shown in FIG. 4a. It has been formed by machining a suitable material, such as circuit board laminate material. Since the structure 52 will be secured to the carrier 40, adhesive material is applied for that purpose. In FIG. 4b, an adhesive layer 54, which may be temporarily supported by a carrier, e.g., kraft paper 56, is shown secured to the top of the picture frame structure 52. FIG. 4c shows sub-assembly 42 after "window-opening" areas 58 have been created by partial removal of the adhesive material 54 and kraft paper carrier material 56. FIG. 4d shows sub-assembly 42 after full removal of the kraft paper carrier material 56 from the adhesive material 54.

Figure 5:
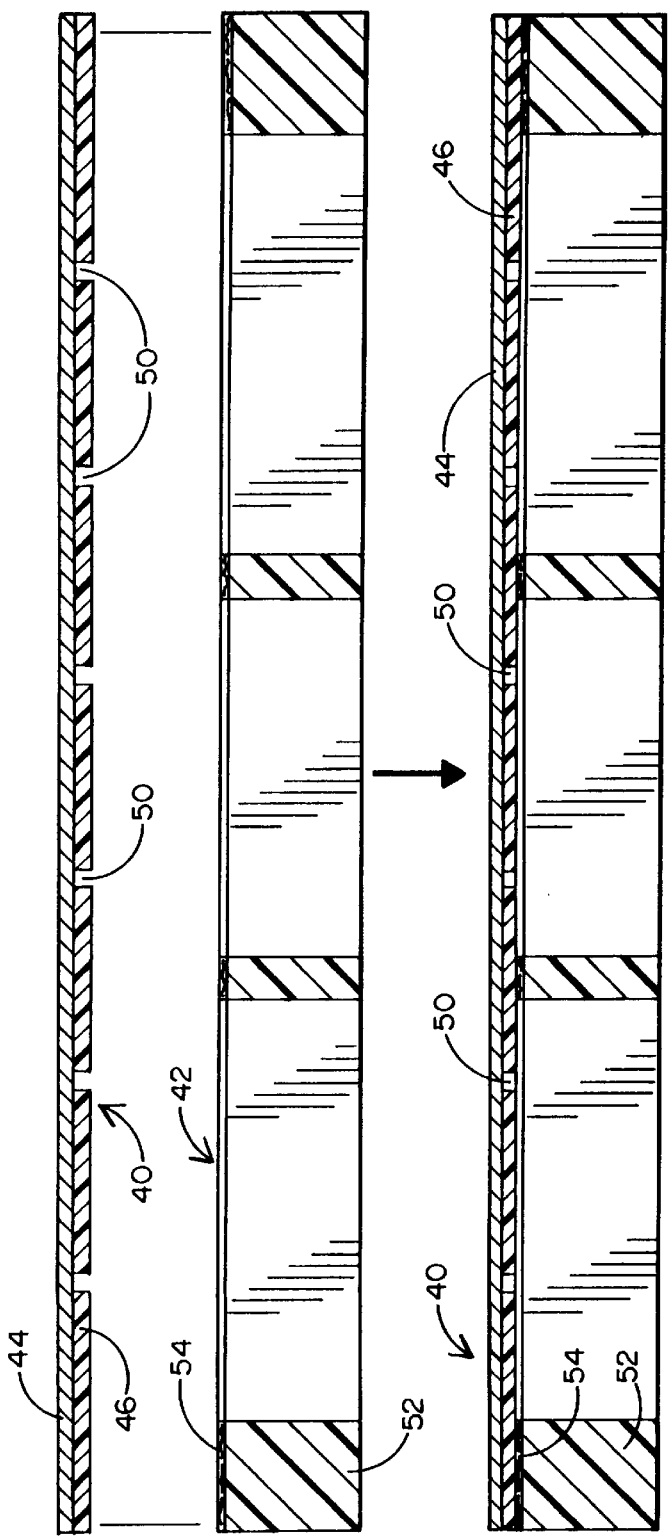
FIG. 5 illustrates the joining of the two sub-assemblies.
Figure 6:
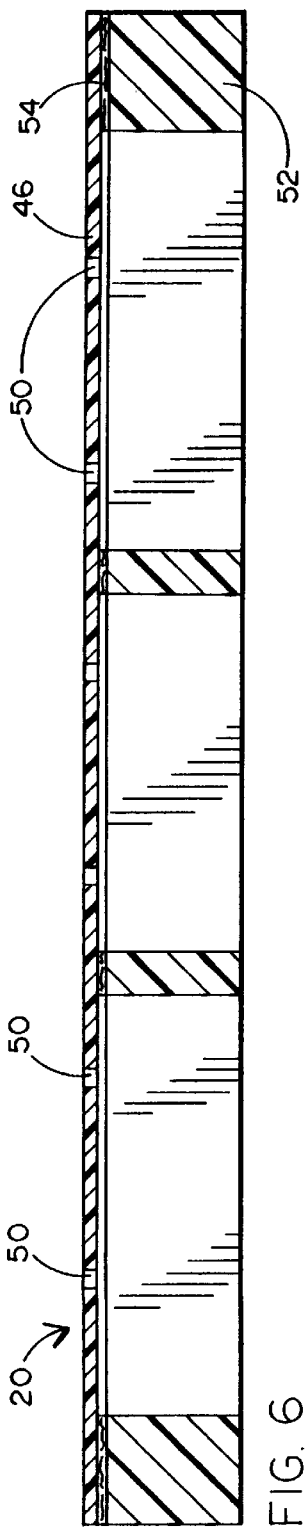
FIG. 6 shows the completed neo-wafer structure.

The next step in the process is securing the sub-assemblies 40 and 42 together, as shown in FIG. 5. (The via-providing carrier sub-assembly 40 is upside-down as compared to FIG. 3e). It is desirable to heat press the sub-assemblies 40 and 42 together to improve adhesion. FIG. 6 shows the complete structure after the aluminum shim stock carrier 44 has been removed by etching, thereby exposing the polyimide layer 46. The two sub-assemblies 40 and 42 have been combined to form the supporting structure of neo-wafer 20.

The neo-wafer frame is now ready for insertion of the pre-tested chips in the structure of the neo-wafer, preparatory to process steps required for eventual stacking of the encapsulated chips. As previously stated, the chips have been obtained as a result of processing in wafer form, so that the initial wafer material contains the integrated circuitry; and such circuitry is contained in individual chips after they have been diced from the wafer. These chips have been pretested so that only "known good" chips are used in the re-wafering process described in detail in this application.

Testing of chips occurs at several points in the process described in this application. At the initial wafer level, in which chips are created, two types of testing may be used. Parametric testing checks for current leakage and voltages, which are DC operational parameters. Functional testing, at the initial wafer level, is done at room temperature with probes, without pushing frequencies to the limit. A limited number of performance specifications are checked.

After such testing, the die (chips) are designated "good" or "not good". Among the die that pass this testing at the wafer lever, there are two options. Either they can be used as is, but then their long-term reliability is not known. Or they can go to another level of testing, which requires the die to be tested at different temperatures, raising the temperatures as the test progresses. That is called the burn-in and temperature cycling test. If the die pass the latter set of tests, then they become "known good die", because of improved long-term reliability.

Various other tests are later conducted on chips which are re-wafered, processed in a neo-wafer, diced to create encapsulated layer units, and subsequently stacked.

FIGS. 7 and 8, in which the structure of FIG. 6 is shown in inverted position, illustrate the insertion of known-good chips 60 into the respective chambers (cavities) 62 formed in the frame of neo-wafer 20. The chips 60 each have a plurality of conductive bumps 64 which extend through the openings (vias) 50 previously formed by photo-lithography processing in the cured polyimide layer 46 (see FIGS. 3d and 3e). The precise location of the openings 50 by photo-patterning provides precise location of the respective chips 60 and their conductive bumps 64. The bumps, preferably formed of gold, have been formed by standard methods on top of IO (input/output) terminals of the chips. Their height should cause them to project above the upper surface of polyimide layer 46, which may be as thin as approximately 0.5 mil. The bumps 64 should extend beyond the polyimide layer 46 to ensure their engagement with conductive traces on the polyimide layer. The conductive bumps 64 should have a diameter slightly less than the diameter of the respective openings 50 through which they extend.

In placing the chips 60 in the chambers 62, the chip bumps 64 are aligned with the openings 50, and the chips are attached to the cured polyimide layer 46 by suitable adhesive material, such as potting epoxy, thereby positioning the chips as shown in FIG. 8.

FIG. 9 shows encapsulating material 66, such as potting epoxy, which has been flowed into the cavities 62. It fills the space around each chip 60. When the potting epoxy 66 has been cured, the chips 60 are firmly encapsulated in the neo-wafer 20.

The neo-wafer 20 is shown in the process steps of FIGS. 10–15 with encapsulating material 66 below the chips 60 and with the bonding bumps 64 extending upward from the chip. FIG. 10 shows the neo-wafer after the extending portions of bumps 64 have been cleared away so their upper ends are flush with the upper surface 68 of polyimide layer 46. In FIG. 11, reroute traces 70 have been metallized on the face of the neo-wafer, using photo-lithography. The traces/leads 70 are used to connect the I/O terminals of the chips to one or more sides of the layer units, which will be diced from the neo-wafer for stacking.

FIG. 12 illustrates a polyimide overcoating layer 72 which acts as a dielectric over the metallized conductors 70. In FIG. 13, a photoresist layer 74 is shown above polyimide layer 72. It has been exposed and developed to provide openings, or vias, 76 which reach the metal traces 70. FIG. 14 shows the structure after removal of the photoresist layer 74.

The purpose of the vias 76 is to permit testing of the chips before the neo-wafer is diced. This testing is to insure that each chip has reliable electrical connection through the bumps 64 and traces 70 to the sides of the layer unit where bussing conductors will be formed, after stacking of a plurality of the chip-encapsulating layer units. Further testing after the layer units have been diced from the neo-wafer may be performed, if required. When the layer units are stacked to form a dense electronic package, the adhesive (e.g., epoxy) between adjacent layers will fill the vias 76.

FIG. 15 shows the neo-wafer secured temporarily to a backing substrate (supporting plate) 80, which permits a scribing process to be used to form criss-crossing linear cuts 82, which will separate the chip-encapsulating layer units from one another, as the dicing of the neo-wafer occurs. The cuts 82 are deep enough to be slightly deeper than the final thickness of the diced units.

In FIG. 16, the substrate 80 is shown on top of the neo-wafer. The neo-wafer is ready for "back-grinding", in which a grinding process is used to remove some of the potting material 66, as shown in FIG. 17. The layer units 88 intended for stacking have now been diced from the neo-wafer, i.e., completely separated from one another by the cuts 82. When the substrate 80 has been removed, individual, equal-area layer units 88 ready for stacking, will be demounted and released.

As shown in FIG. 18, each layer unit 88 will include at least one encapsulated chip 22/60, encapsulating (potting) material 24/66, and layers 46 and 72 of dielectric material on top of the layer, between which leads (traces) 70 are electrically insulated.

Figure 19:
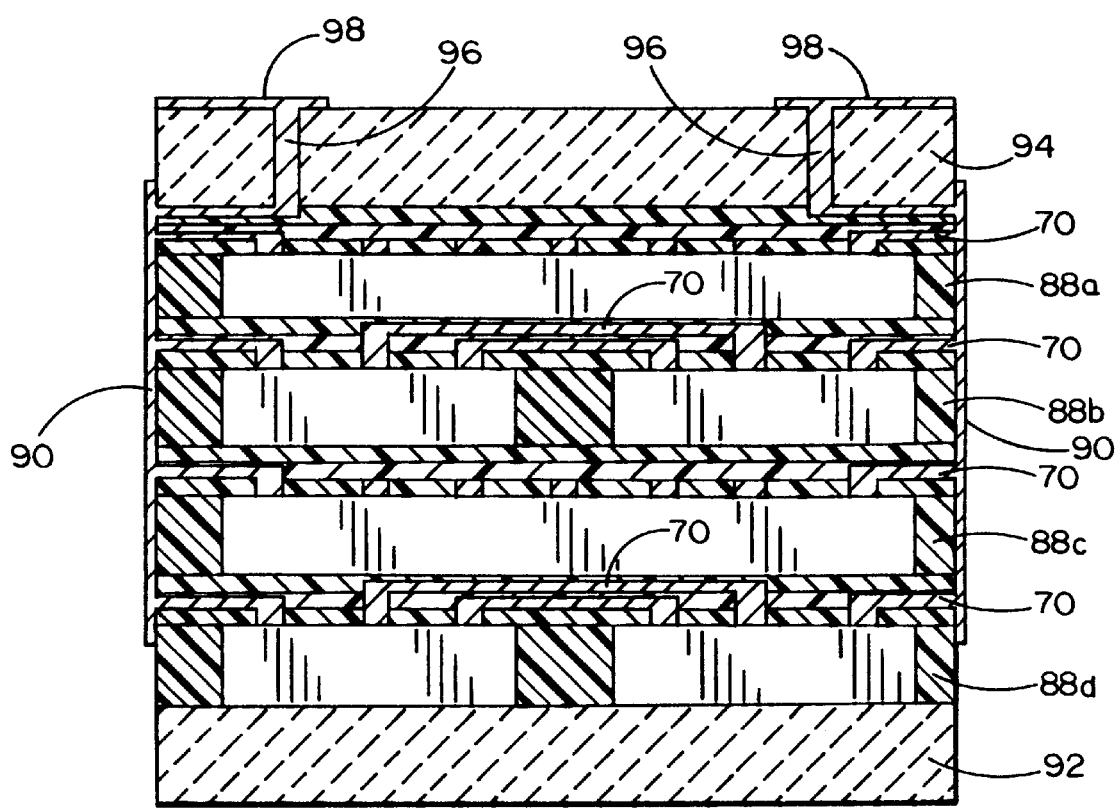
FIG. 19 is a cross-section taken through a stack of four chip-containing layers, with upper and lower ceramic support layers.

The number of layer units in a stack is a matter of design choice. The semi-conductor material in each layer is insulated from the layer below by the dielectric material on top of the lower layer. FIG. 19 shows a small stack, which includes four of the equal area neo-chip layer units, designated 88a, 88b, 88c, and 88d. Layers 88a and 88c each show a single IC chip encapsulated in potting material, and layers 88b and 88d each show two IC chips encapsulated in potting material. All of the layer units have, on their top surfaces, conductive traces 70, which lead to one of two sides of the stack, where they may be connected to vertically extending traces 90, which function as bussing leads. Three or four sides of the stack may be used for this purpose, if desired. The two-chip layers 88b band 88d are shown having an additional layer of insulated traces 70 which are used to electrically interconnect the two chips included in the same layer.

To provide stack support, a ceramic layer 92 is shown secured to the bottom of the stack, and another ceramic layer 94 is secured to the top of the stack. The top ceramic layer 94 is shown having vias 96 which contain conductive metal, and which permit electrical leads to reach pads (terminals) 98 on top of the stack, where such pads are available for wire-bonding to exterior circuitry.

From the foregoing description, it will be apparent that the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A method of preparing a plurality of pre-formed IC chips for encapsulation in stackable layers of an electronic package, comprising the following steps;

forming a neo-wafer structure having a flat surface;

photo-patterning and processing the flat surface to precisely locate and form vias in the flat surface;

providing a plurality of IC chips, each having conductive bumps connected to the terminals of the IC chip;

inserting the conductive bumps of the IC chips through the vias in the flat neo-wafer surface, in order to precisely locate the chips with respect to one another, and in order to expose the conductive bumps to suitable electrical connections on the other side of the flat neo-wafer surface from the IC chips;

covering the chips in the neo-wafer with non-conductive encapsulating material which supports the chips; and dicing the neo-wafer to provide a plurality of separate stackable layers, each having the same area and each containing at least one encapsulated chip.

2. The method of claim 1 in which;

the neo-wafer structure is formed with a plurality of separate chambers next to the flat surface;

the vias formed in the flat surface of the neo-wafer open into the respective chambers; and the non-conductive encapsulating material in the neo-wafer is separated into a plurality of separate segments by the chambers formed in the neo-wafer.

3. The method of claim 1 in which the IC chips each are pre-formed by a wafering process, diced into separate chips, and pre-tested to provide known-good chips for insertion in the neo-wafer.

4. The method of claim 2 in which the IC chips each are pre-formed by a wafering process, diced into separate chips, and pre-tested to provide known-good chips for insertion in the neo-wafer.

5. The method of claim 3 in which the neo-wafer comprises two sub-assemblies:

a flat sub-assembly formed as a supporting plate carrying a layer of dielectric material developable by photo-lithography; and a frame-like sub-assembly having a plurality of open chambers formed therein by chamber-defining walls.

6. The method of claim 4 in which the neo-wafer comprises two sub-assemblies:

a flat sub-assembly formed as a supporting plate carrying a layer of dielectric material developable by photo-lithography; and a frame-like sub-assembly having a plurality of open chambers formed therein by chamber-defining walls.

7. The method of claim 3 in which:

dielectric material is applied to the flat-neo-wafer surface to cover the conductive bumps;

vias are formed in the dielectric material to expose the conductive bumps;

electrical conductors are formed on top of the dielectric material, which conductors (a) are connected to the conductive bumps, and (b) lead to one or more edges of the respective encapsulated IC chips; and dielectric material is applied over the electrical conductors.

8. The method of claim 4 in which:

dielectric material is applied to the flat-neo-wafer surface to cover the conductive bumps;

vias are formed in the dielectric material to expose the conductive bumps;

electrical conductors are formed on top of the dielectric material, which conductors (a) are connected to the conductive bumps, and (b) lead to one or more edges of the respective encapsulated IC chips; and dielectric material is applied over the electrical conductors.

9. The method of claim 5 in which:

dielectric material is applied to the flat-neo-wafer surface to cover the conductive bumps;

vias are formed in the dielectric material to expose the conductive bumps;

electrical conductors are formed on top of the dielectric material, which conductors (a) are connected to the conductive bumps, and (b) lead to one or more edges of the respective encapsulated IC chips; and dielectric material is applied over the electrical conductors.

10. The method of claim 6 in which:

dielectric material is applied to the flat-neo-wafer surface to cover the conductive bumps;

vias are formed in the dielectric material to expose the conductive bumps;

electrical conductors are formed on top of the dielectric material, which conductors (a) are connected to the conductive bumps, and (b) lead to one or more edges of the respective encapsulated IC chips; and dielectric material is applied over the electrical conductors.

11. A method of preparing a plurality of pre-formed chips for encapsulation in stackable layers of a multi-chip package, comprising the following steps;

forming a neo-wafer structure having a flat surface;

processing the flat surface to precisely locate and form vias in the flat surface;

providing a plurality of chips, each having signal-carrying bumps connected to the terminals of the chip;

inserting the bumps of the chips through the vias in the flat neo-wafer surface, in order to precisely locate the chips with respect to one another, and in order to expose the bumps to suitable connections on the other side of the flat neo-wafer surface from the chips;

covering the chips in the neo-wafer with non-conductive encapsulating material which supports the chips; and dicing the neo-wafer to provide a plurality of separate stackable layers, each having the same area and each containing at least one encapsulated chip.

12. The method of claim 11 in which;

the neo-wafer structure is formed with a plurality of separate chambers next to the flat surface;

the vias formed in the flat surface of the neo-wafer open into the respective chambers; and the non-conductive encapsulating material in the neo-wafer is separated into a plurality of separate segments by the chambers formed in the neo-wafer.

13. The method of claim 11 in which the chips each are pre-formed by a wafering process, diced into separate chips, and pre-tested before insertion in the neo-wafer.

14. The method of claim 12 in which the chips each are pre-formed by a wafering process, diced into separate chips, and pre-tested before insertion in the neo-wafer.

15. The method of claim 12 in which the neo-wafer comprises two sub-assemblies:

a flat sub-assembly formed as a supporting plate carrying a layer of non-conductive material; and a frame-like sub-assembly having a plurality of open chambers formed therein by chamber-defining walls.

* * * * *